United States Patent
Zeng et al.

(10) Patent No.: US 9,621,164 B2
(45) Date of Patent: Apr. 11, 2017

(54) DRIVING CIRCUIT

(71) Applicant: Shenzhen China Star Optoelectronics Technology Co., Ltd., Shenzhen, Guangdong (CN)

(72) Inventors: Yuchao Zeng, Guangdong (CN); Tai-jiun Hwang, Guangdong (CN)

(73) Assignee: Shenzhen China Star Optoelectronics Technology Co., Ltd, Shenzhen, Guangdong (CN)

( * ) Notice: Subject to any disclaimer, the term of this patent is extended or adjusted under 35 U.S.C. 154(b) by 0 days.

(21) Appl. No.: 14/761,409

(22) PCT Filed: Jun. 5, 2015

(86) PCT No.: PCT/CN2015/080877
§ 371 (c)(1),
(2) Date: Jul. 16, 2015

(87) PCT Pub. No.: WO2016/183883
PCT Pub. Date: Nov. 24, 2016

(65) Prior Publication Data
US 2016/0344388 A1     Nov. 24, 2016

(30) Foreign Application Priority Data
May 20, 2015  (CN) .......................... 2015 1 02612149

(51) Int. Cl.
*H03K 19/0175*   (2006.01)
*G09G 3/36*      (2006.01)
*G09G 3/3266*    (2016.01)
*H03K 19/20*     (2006.01)

(52) U.S. Cl.
CPC ... *H03K 19/017509* (2013.01); *G09G 3/3266* (2013.01); *G09G 3/3677* (2013.01); *H03K 19/20* (2013.01); *G09G 2310/0213* (2013.01)

(58) Field of Classification Search
CPC ........... H03K 19/017509; H03K 19/20; G09G 3/3266; G09G 3/3677; G09G 2310/0213
USPC ..................... 326/82; 345/99, 100, 42, 204
See application file for complete search history.

(56) References Cited

U.S. PATENT DOCUMENTS

| | | | | |
|---|---|---|---|---|
| 5,883,609 A * | 3/1999 | Asada | ................... | G09G 3/3648 345/100 |
| 6,437,766 B1 * | 8/2002 | Matsushima | ........ | G09G 3/3674 345/100 |
| 7,420,534 B2 * | 9/2008 | Yamashita | ........... | G09G 3/3648 345/100 |

\* cited by examiner

*Primary Examiner* — Daniel D Chang
(74) *Attorney, Agent, or Firm* — Andrew C. Cheng

(57) ABSTRACT

A driving circuit is proposed. The driving circuit includes a scanning driving circuit and at least one group of combinational logic circuits. A first group of scanning signals output by an output terminal of the scanning driving circuit. An input terminal of the at least one group of combinational logic circuits is connected to the output terminal of the scanning driving circuit or is connected to an output terminal of a preceding group of combinational logic circuits. At least one second group of scanning signals output by the output terminal of the at least one group of combinational logic circuits for the driving circuit to output more groups of scanning signals. Accordingly, it is not necessary to use multiple groups of independent driving circuits. Besides, the combination of the scanning driving circuit and the groups of combinational logic circuits reduce cost.

15 Claims, 4 Drawing Sheets

Fig. 6
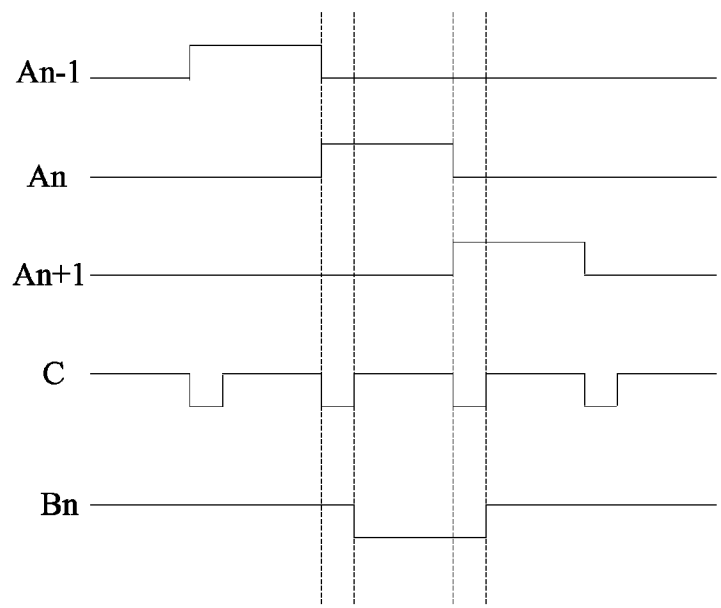
Fig. 7
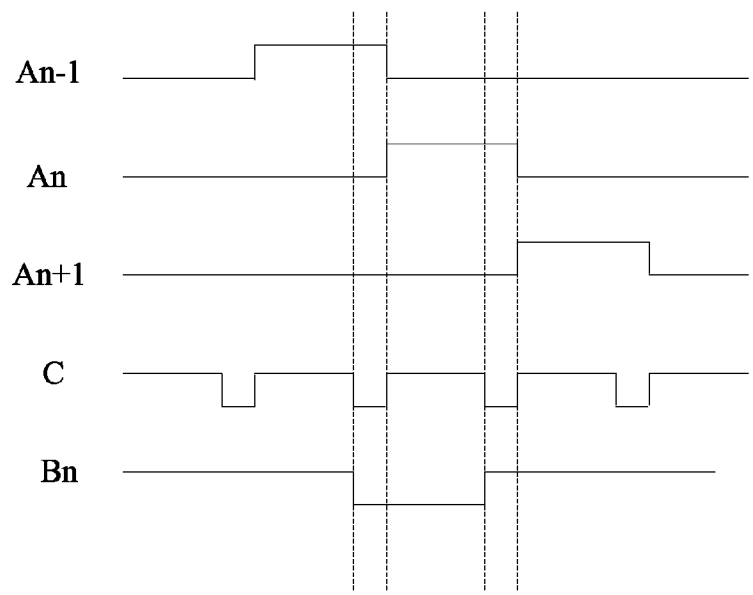
Fig. 8

DRIVING CIRCUIT

BACKGROUND OF THE INVENTION

1. Field of the Invention

The present invention relates to the field of liquid crystal display technology, and more particularly, to a driving circuit applying to an active-matrix organic light emitting diode (AMOLED).

2. Description of the Prior Art

A plurality of scanning signals are used by a compensating circuit inside a conventional AMOLED. The plurality of scanning signals may be different in levels and relative phases and widths.

The conventional technology uses two independent groups of scanning driving circuits 101 and 102 to obtain a plurality of scanning signals, as shown in FIG. 1. The scanning driving circuit 101 outputs a group of scanning signals E1, . . . , En. The scanning driving circuit 102 outputs a group of scanning signals F1, . . . , Fn. However, costs of use of the scanning driving circuits increase.

SUMMARY OF THE INVENTION

An object of the present invention is to provide a driving circuit using fewer groups of independent scanning driving circuits. It helps save costs.

In one aspect of the present invention, a driving circuit comprises a scanning driving circuit and at least one group of combinational logic circuits. A first group of scanning signals output by an output terminal of the scanning driving circuit. An input terminal of the at least one group of combinational logic circuits is connected to the output terminal of the scanning driving circuit or is connected to an output terminal of a preceding group of combinational logic circuits. At least one second group of scanning signals is output by the output terminal of the at least one group of combinational logic circuits for the driving circuit to output more groups of scanning signals. The at least one group of logic circuits comprise a first group of combinational logic circuits and a second group of combinational logic circuits. An input terminal of the second group of combinational logic circuits is connected to an output terminal of the first group of combinational logic circuits. Both of the first group of combinational logic circuits and the second group of combinational logic circuits comprise at least one logic circuit having a first input terminal, a second input terminal, a third input terminal, a selector, an inverter, a first NAND gate, a second NAND gate, and an AND gate. The first input terminal, the second input terminal, and the third input terminal all receive three consecutive scanning signals from the first group of scanning signals output by the scanning driving circuit. A scanning signal is generated by the logic circuit according to the three consecutive scanning signals. An input terminal of the selector comprises a first input terminal and a third input terminal of the logic circuit. An output terminal of the selector connects to an input terminal of the first NAND gate. Another one input terminal of the first NAND gate connects to an output terminal of the inverter. An input terminal of the second NAND gate is used as the second input terminal. An output terminal of the first NAND gate and an output terminal of the second NAND gate connect to an input terminal of the AND gate. An output terminal of the AND gate outputs the scanning signal.

Furthermore, the selector comprises a signal terminal connected to a first controlling signal, the inverter comprises an input terminal connected to a second controlling signal, and the second NAND gate comprises another input terminal connected to a third controlling signal.

Furthermore, the scanning signal satisfies logic relations as follows:

$$Cn = An{-}1 * \text{phase} + An{+}1 * \overline{\text{phase}};$$

$$Bn = \overline{An} * \overline{C} * \overline{Cn} * \overline{D};$$

where Bn refers to the scanning signal, n is an integral larger than zero, Cn represents a signal output by the selector, phase refers to the first controlling signal, C refers to the third controlling signal, D refers to the second controlling signal, and An−1, An, and An+1 refer to the three consecutive scanning signals.

Furthermore, the logic circuit controls phase lag and phase lead of the scanning signal based on a high or low level of the first controlling signal, and the logic circuit adjusts the width of the phase of the scanning signal according to the second controlling signal and the third controlling signal.

Furthermore, the signal terminal of the selector is connected to the first controlling signal, and the input terminal of the inverter and the another input terminal of the second NAND gate are connected to the third controlling signal.

Furthermore, the scanning signal satisfies logic relations as follows:

$$Cn = An{-}1 * \text{phase} + An{+}1 * \overline{\text{phase}};$$

$$Bn = \overline{An} * \overline{C} * \overline{Cn} * \overline{C};$$

where Bn refers to the scanning signal, n is an integral larger than zero, Cn represents a signal output by the selector, phase refers to the first controlling signal, C refers to the third controlling signal, and An−1, An, and An+1 refer to the three consecutive scanning signals.

Furthermore, the logic circuit controls phase lag and phase lead of the scanning signal based on a high or low level of the first controlling signal.

In another aspect of the present invention, a driving circuit comprises a scanning driving circuit and at least one group of combinational logic circuits. A first group of scanning signals output by an output terminal of the scanning driving circuit. An input terminal of the at least one group of combinational logic circuits is connected to the output terminal of the scanning driving circuit or is connected to an output terminal of a preceding group of combinational logic circuits. At least one second group of scanning signals is output by the output terminal of the at least one group of combinational logic circuits for the driving circuit to output more groups of scanning signals.

Furthermore, the at least one group of logic circuits comprise a first group of combinational logic circuits having at least one logic circuit, the logic circuit comprising a first input terminal, a second input terminal, and a third input terminal; the first input terminal, the second input terminal, and the third input terminal all receive three consecutive scanning signals from the first group of scanning signals output by the scanning driving circuit; a scanning signal is generated by the logic circuit according to the three consecutive scanning signals.

Furthermore, the logic circuit further comprises a selector, an inverter, a first NAND gate, a second NAND gate, and an AND gate; an input terminal of the selector comprises a first input terminal and a third input terminal of the logic circuit, an output terminal of the selector is connected to an input terminal of the first NAND gate; another one input terminal of the first NAND gate is connected to an output terminal of the inverter; an input terminal of the second NAND gate is used as the second input terminal; an output terminal of the first NAND gate and an output terminal of the second NAND gate are connected to an input terminal of the AND gate, and an output terminal of the AND gate outputting the scanning signal.

Furthermore, the selector comprises a signal terminal connected to a first controlling signal, the inverter comprises an input terminal connected to a second controlling signal, and the second NAND gate comprises another input terminal connected to a third controlling signal.

Furthermore, the scanning signal satisfies logic relations as follows:

$$Cn = An-1 * phase + An+1 * \overline{phase};$$

$$Bn = \overline{An * C * Cn * \overline{D}};$$

where Bn refers to the scanning signal, n is an integral larger than zero, Cn represents a signal output by the selector, phase refers to the first controlling signal, C refers to the third controlling signal, D refers to the second controlling signal, and An−1, An, and An+1 refer to the three consecutive scanning signals.

Furthermore, the logic circuit controls phase lag and phase lead of the scanning signal based on a high or low level of the first controlling signal, and the logic circuit adjusts the width of the phase of the scanning signal according to the second controlling signal and the third controlling signal.

Furthermore, the signal terminal of the selector is connected to the first controlling signal, and the input terminal of the inverter and the another input terminal of the second NAND gate are connected to the third controlling signal.

Furthermore, the scanning signal satisfies logic relations as follows:

$$Cn = An-1 * phase + An+1 * \overline{phase};$$

$$Bn = \overline{An * C * Cn * \overline{C}};$$

where Bn refers to the scanning signal, n is an integral larger than zero, Cn represents a signal output by the selector, phase refers to the first controlling signal, C refers to the third controlling signal, and An−1, An, and An+1 refer to the three consecutive scanning signals.

Furthermore, the logic circuit controls phase lag and phase lead of the scanning signal based on a high or low level of the first controlling signal.

Furthermore, the at least one group of logic circuits further comprise a second group of combinational logic circuits, an input terminal of the second group of combinational logic circuits is connected to an output terminal of the first group of combinational logic circuits.

The benefit of the present invention is that, the present invention makes it possible that a plurality of groups of scanning signals can be output at the same time, which facilitates reducing costs. What the present invention uses is that a driving circuit comprises a scanning driving circuit and at least one group of combinational logic circuits. The output terminal of the scanning driving circuit outputs a first group of scanning signals. The input terminal of at least one group of combinational logic circuits is connected to the output terminal of the scanning driving circuit or connected to the output terminal of the preceding group of combinational logic circuits. The output terminal of at least one group of combinational logic circuits is used for outputting at least one second group of scanning signals so that the driving circuit can output a plurality of groups of scanning signals. Accordingly, it is not necessary to use a plurality of groups of independent driving circuits.

BRIEF DESCRIPTION OF THE DRAWINGS

For better understanding embodiments of the present invention, the following detailed description taken in conjunction with the accompanying drawings is provided. Apparently, the accompanying drawings are merely for some of the embodiments of the present invention. Any ordinarily skilled person in the technical field of the present invention could still obtain other accompanying drawings without use laborious invention based on the present accompanying drawings.

FIG. 7 is a timing diagram of the logic circuit shown in FIG. 6 when the first controlling signal is on the high level.

FIG. 8 is a timing diagram of the logic circuit shown in FIG. 6 when the first controlling signal is on the low level.

DETAILED DESCRIPTION OF THE PREFERRED EMBODIMENTS

The accompanying drawings are included to provide a further understanding of the invention, and are incorporated in and constitute a part of this specification. The drawings illustrate embodiments of the invention and, together with the description, serve to explain the principles of the invention.

Figure 1:
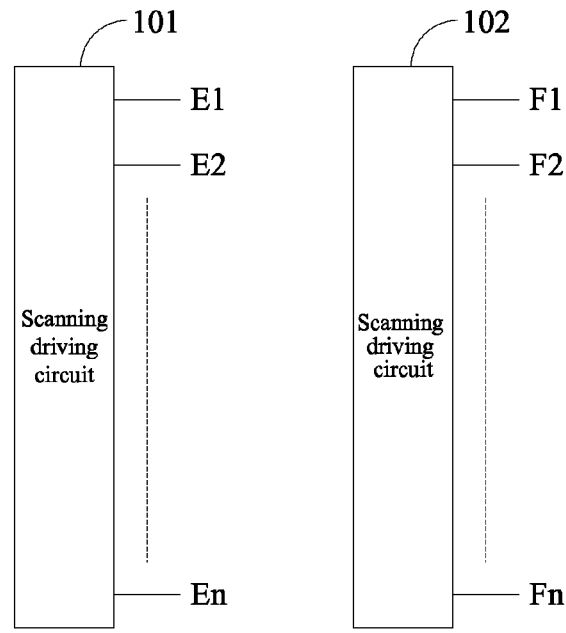
FIG. 1 shows a schematic diagram of two conventional independent groups of scanning driving circuits.
Figure 2:
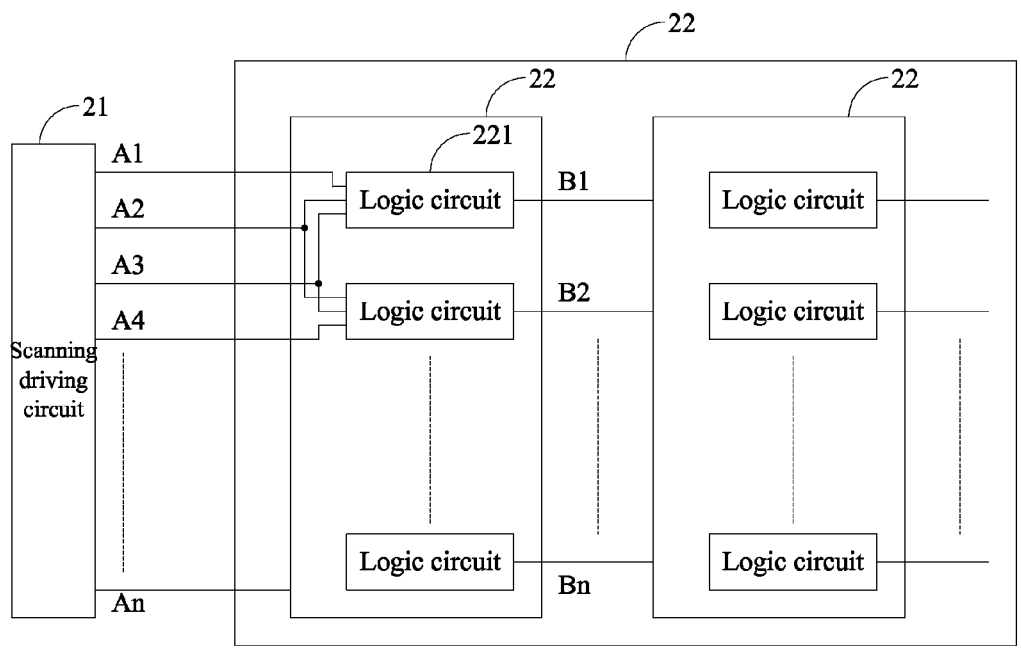
FIG. 2 is a schematic diagram of a driving circuit according to a first embodiment of the present invention.

Please refer to FIG. 2. FIG. 2 is a schematic diagram of a driving circuit according to a first embodiment of the present invention. The driving circuit is used in AMOLED for supplying a compensating circuit inside the AMOLED with a plurality of groups of scanning signal sets. The driving circuit comprises a scanning driving circuit 21 and at least one group of combinational logic circuits 22. An output terminal of the scanning driving circuit 21 outputs a group of first scanning signals A1, . . . , An where n is an integral larger than zero.

An input terminal of at least one group of combinational logic circuits 22 is connected to the output terminal of the scanning driving circuit 21 or connected to an output terminal of the preceding group of combinational logic circuits 22. The output terminal of at least one group of combinational logic circuits 22 is used for outputting at least one second group of scanning signals B1, . . . , Bn so that the driving circuit can output a plurality of groups of scanning signals. In other words, the driving circuit outputs a first group of scanning signals A1, . . . , An and at least one second group of scanning signals B1, . . . , Bn.

Figure 3:
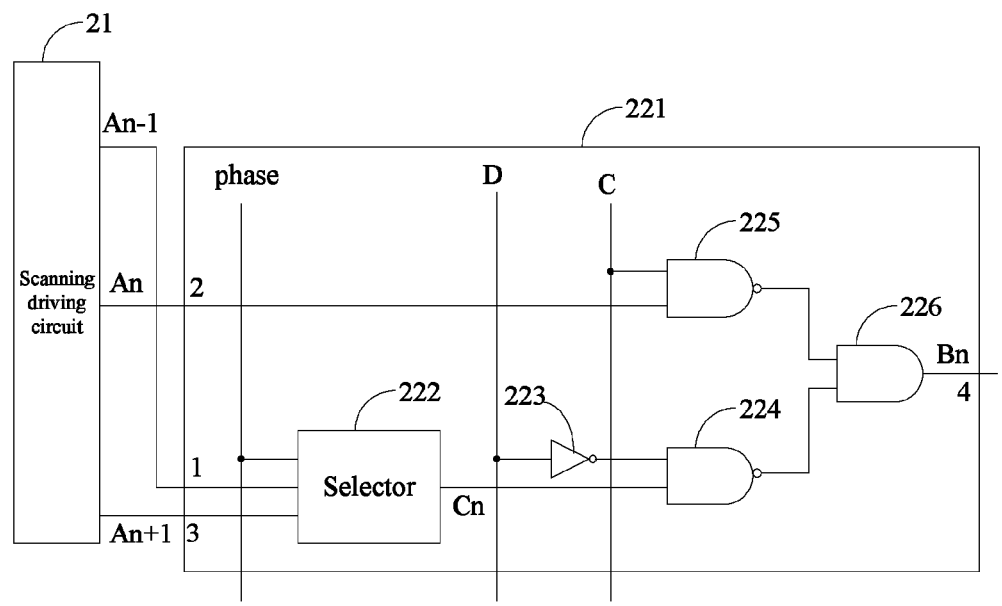
FIG. 3 shows a circuit diagram of a logic circuit as illustrated in FIG. 2.

At least one group of combinational logic circuits 22 comprise a first group of combinational logic circuits 22. The first group of combinational logic circuits 22 comprise at least one logic circuit 221. The logic circuit 221 comprises a first input terminal 1, a second input terminal 2, a third input terminal 3, a fourth input terminal 4, a selector 222, an inverter 223, a first NAND gate 224, a second NAND gate 225, and an AND gate 226, as shown in FIG. 3. The first input terminal 1, the second input terminal 2, and the third input terminal 3 all receive three consecutive scanning signals An−1, An, and An+1 from the first group of scanning signals output by the scanning driving circuit 21. In other words, the first input terminal 1, the second input terminal 2, and the third input terminal 3 all are connected to three consecutive output terminals of the scanning driving circuit 21. The logic circuit 221 generates a scanning signal Bn according to the three consecutive scanning signals An−1, An, and An+1.

The selector 222 comprises an input terminal comprising the first input terminal 1 and the third input terminal 3 of a logic circuit 221. The selector 222 comprises a signal terminal connected to a phase of a first controlling signal. The selector 222 comprises an output terminal connected to one input terminal of the first NAND gate 224. Another input terminal of the first NAND gate 224 is connected to an output terminal of the inverter 223. The inverter 223 comprises an input terminal connected to a second controlling signal D. One input terminal of the second NAND gate 225 is used as the second input terminal 2 of the logic circuit 211. Another input terminal of the second NAND gate 225 is connected to a third controlling signal C. An output terminal of the first NAND gate 224 and an output terminal of the second NAND gate 225 are connected to an input terminal of the AND gate 226. The AND gate 226 comprises an output terminal outputting the scanning signal Bn.

The scanning signal Bn satisfies the following logical relations:

$$Cn = An\text{-}1 * \text{phase} + An\text{+}1 * \overline{\text{phase}}; \quad (1)$$

$$Bn = \overline{An*C} * \overline{Cn*\overline{D}}; \quad (2)$$

where Cn represents a signal output by the selector 222.

The logic circuit 221 controls phase lag and phase lead of the scanning signal Bn based on the high or low level of the phase of the first controlling signal. Also, the logic circuit 221 adjusts the width of the phase of the scanning signal Bn according to the second controlling signal D and the third controlling signal C.

Figure 4:
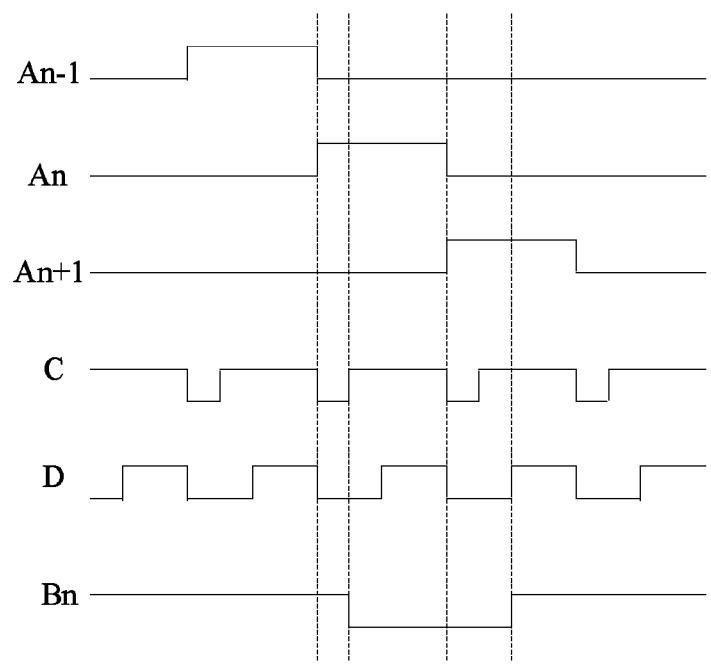
FIG. 4 is a timing diagram of the logic circuit shown in FIG. 3 when the first controlling signal is on the high level.

Please refer to FIG. 4. FIG. 4 is a timing diagram of the logic circuit shown in FIG. 3 when the first controlling signal is on the high level. The timing diagram of the signal Cn=An−1 output by the selector 222, the second controlling signal D, and the third controlling signal C are shown in FIG. 4 when the phase of the first controlling signal is one (that is, high level). The level of the scanning signal Bn is contradictory to the level of the signal An. The phase of the scanning signal Bn is a lag relative to the phase of the signal An. The second controlling signal D and the controlling signal C adjust the width of the phase of the scanning signal Bn.

Figure 5:
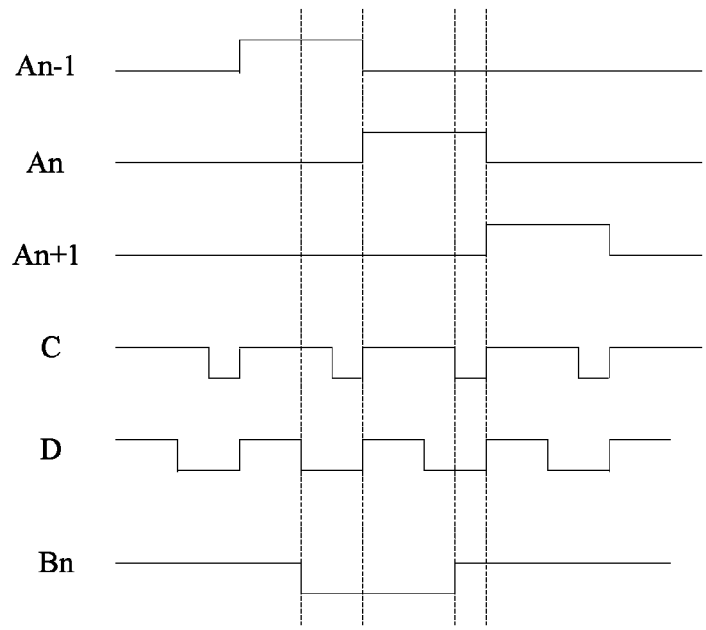
FIG. 5 is a timing diagram of the logic circuit shown in FIG. 3 when the first controlling signal is on the low level.

Please refer to FIG. 5. FIG. 5 is a timing diagram of the logic circuit shown in FIG. 3 when the first controlling signal is on the low level. The timing diagram of the signal Cn=An+1 output by the selector 222, the second controlling signal D, and the third controlling signal C are shown in FIG. 5 when the phase of the first controlling signal is zero (that is, low level). The level of the scanning signal Bn is contradictory to the level of the signal An. The phase of the scanning signal Bn is an advance relative to the phase of the signal An. The second controlling signal D and the third controlling signal C adjust the width of the phase of the scanning signal Bn.

Besides, at least one group of combinational logic circuits 22 further comprise a second group of combinational logic circuits 22. The input terminal of the second group of combinational logic circuits 22 is connected to the output terminal of the first group of combinational logic circuits 22. That is, the input terminal of the second group of combinational logic circuits 22 is connected to the output terminal of the preceding group of combinational logic circuits 22. The second group of combinational logic circuits 22 are identical to the first group of combinational logic circuits 22 so the second group of combinational logic circuits 22 will not be detailed in this specification.

At least one group of combinational logic circuits 22 can be integrated on the chip of the scanning driving circuit 21. Or, at least one group of combinational logic circuits 22 can be integrated on the panel of the liquid crystal display (LCD).

The present invention makes it possible that a plurality of groups of scanning signals can be output at the same time, which facilitates reducing costs. This method the present invention uses is that the driving circuit comprises at least one group of combinational logic circuits 22. The input terminal of at least one group of combinational logic circuits 22 is connected to the output terminal of the scanning driving circuit 21 or connected to the output terminal of the preceding group of combinational logic circuits 22. The output terminal of at least one group of combinational logic circuits 22 is used for outputting at least one second group of scanning signals so that the driving circuit can output a plurality of groups of scanning signals. Accordingly, it is not necessary to use a plurality of groups of independent driving circuits. Besides, the combination of the scanning driving circuit 21 and the plurality of groups of combinational logic circuits 22 realizes a Gate Driver on Array (GOA) circuit more easily.

Figure 6:
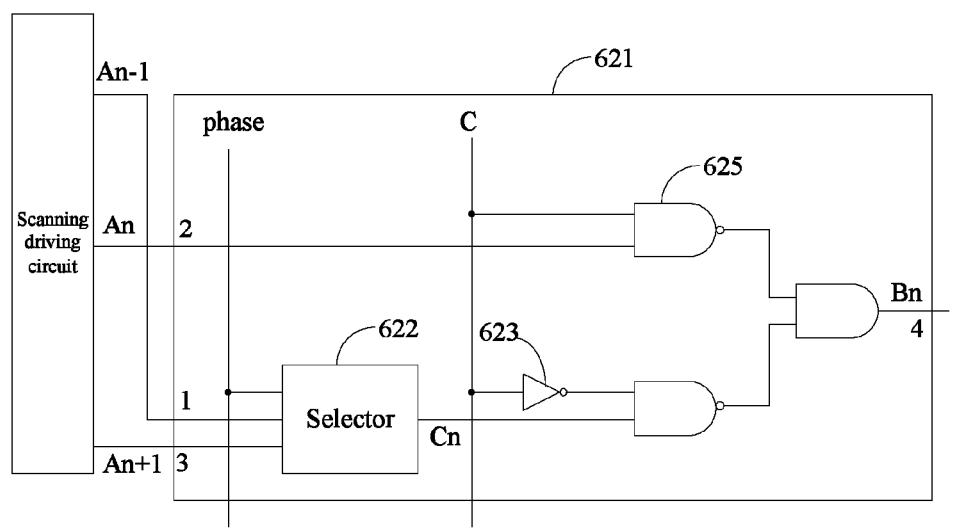
FIG. 6 is a schematic diagram of a driving circuit according to a second embodiment of the present invention.

Please refer to FIG. 6. FIG. 6 is a schematic diagram of the structure of a logic circuit 621 according to a second embodiment of the present invention. The logic circuit 621 is somehow different from the logic circuit 221 appearing in the first embodiment. The logic circuit 621 comprises a selector 622 comprising a signal terminal connected to the phase of a first controlling signal. The logic circuit 621 comprises an inverter 623 comprising an input terminal and a second NAND gate 625 comprising another input terminal Both of the input terminal of the inverter 623 and the input terminal of the second NAND gate 625 are connected to a third controlling signal C.

A scanning signal Bn satisfies the following logic relations:

$$Cn = An\text{-}1 * \text{phase} + An\text{+}1 * \overline{\text{phase}}; \quad (3)$$

$$Bn = \overline{An*C} * \overline{Cn*\overline{C}}; \quad (4)$$

where Cn refers to a signal output by the selector 622.

The logic circuit 621 controls phase lag and phase lead of the scanning signal Bn based on the high or low level of the phase of the first controlling signal. Also, the logic circuit 621 adjusts the width of the phase of the scanning signal Bn according to the third controlling signal C.

Please refer to FIG. 7. FIG. 7 is a timing diagram of the logic circuit shown in FIG. 6 when the first controlling signal is on the high level. The timing diagram of the signal Cn=An−1 output by the selector 622 and the third controlling signal C are shown in FIG. 7 when the phase of the first controlling signal is one (that is, high level). The level of the scanning signal Bn is contradictory to the level of the signal An. The phase of the scanning signal Bn is a lag relative to the phase of the signal An. The width of the phase of the scanning signal Bn is the same as the width of the signal An. The width of the phase of the scanning signal Bn is not adjustable.

Please refer to FIG. 8. FIG. 8 is a timing diagram of the logic circuit shown in FIG. 6 when the first controlling signal is on the low level. The timing diagram of the signal Cn=An+1 output by the selector 622 and the third controlling signal C are shown in FIG. 8 when the phase of the first controlling signal is zero (that is, low level). The level of the scanning signal Bn is contradictory to the level of the signal An. The phase of the scanning signal Bn is an advance relative to the phase of the signal An. The width of the phase of the scanning signal Bn is the same as the width of the signal An. The width of the phase of the scanning signal Bn is not adjustable.

To sum up, the present invention makes it possible that the plurality of groups of scanning signals can be output at the same time, which facilitates reducing costs. What the present invention uses is that the driving circuit comprises the scanning driving circuit and at least one group of combinational logic circuits. The output terminal of the scanning driving circuit outputs the first group of scanning signals. The input terminal of at least one group of combinational logic circuits is connected to the output terminal of the scanning driving circuit or connected to the output terminal of the preceding group of combinational logic circuits. The output terminal of at least one group of combinational logic circuits is used for outputting at least one second group of scanning signals so that the driving circuit can output a plurality of groups of scanning signals. Accordingly, it is not necessary to use a plurality of groups of independent driving circuits. Besides, the combination of the scanning driving circuit and the plurality of groups of combinational logic circuits realizes the GOA circuit more easily.

The present disclosure is described in detail in accordance with the above contents with the specific preferred examples. However, this present disclosure is not limited to the specific examples. For the ordinary technical personnel of the technical field of the present disclosure, on the premise of keeping the conception of the present disclosure, the technical personnel can also make simple deductions or replacements, and all of which should be considered to belong to the protection scope of the present disclosure.

What is claimed is:

1. A driving circuit, comprising a scanning driving circuit and at least one group of combinational logic circuits, a first group of scanning signals output by an output terminal of the scanning driving circuit, an input terminal of the at least one group of combinational logic circuits connected to the output terminal of the scanning driving circuit or connected to an output terminal of a preceding group of combinational logic circuits, at least one second group of scanning signals output by the output terminal of the at least one group of combinational logic circuits for the driving circuit to output more groups of scanning signals;

the at least one group of logic circuits comprising a first group of combinational logic circuits and a second group of combinational logic circuits, an input terminal of the second group of combinational logic circuits connected to an output terminal of the first group of combinational logic circuits, both of the first group of combinational logic circuits and the second group of combinational logic circuits comprising at least one logic circuit, the logic circuit comprising a first input terminal, a second input terminal, a third input terminal, a selector, an inverter, a first NAND gate, a second NAND gate, and an AND gate, the first input terminal, the second input terminal, and the third input terminal all receive three consecutive scanning signals from the first group of scanning signals output by the scanning driving circuit, a scanning signal generated by the logic circuit according to the three consecutive scanning signals, an input terminal of the selector comprising a first input terminal and a third input terminal of the logic circuit, an output terminal of the selector connected to an input terminal of the first NAND gate, another one input terminal of the first NAND gate connected to an output terminal of the inverter, an input terminal of the second NAND gate used as the second input terminal, an output terminal of the first NAND gate and an output terminal of the second NAND gate connected to an input terminal of the AND gate, and an output terminal of the AND gate outputting the scanning signal.

2. The driving circuit as claimed in claim 1, wherein the selector comprises a signal terminal connected to a first controlling signal, the inverter comprises an input terminal connected to a second controlling signal, and the second NAND gate comprises another input terminal connected to a third controlling signal.

3. The driving circuit as claimed in claim 1, wherein the scanning signal satisfies logic relations as follows:

$$Cn=An-1*\text{phase}+An+1*\overline{\text{phase}};$$

$$Bn=\overline{\overline{An*C}*\overline{Cn*D}};$$

where Bn refers to the scanning signal, n is an integral larger than zero, Cn represents a signal output by the selector, phase refers to the first controlling signal, C refers to the third controlling signal, D refers to the second controlling signal, and An−1, An, and An+1 refer to the three consecutive scanning signals.

4. The driving circuit as claimed in claim 3, wherein the logic circuit controls phase lag and phase lead of the scanning signal based on a high or low level of the first controlling signal, and the logic circuit adjusts the width of the phase of the scanning signal according to the second controlling signal and the third controlling signal.

5. The driving circuit as claimed in claim 1, wherein the signal terminal of the selector is connected to the first controlling signal, and the input terminal of the inverter and the another input terminal of the second NAND gate are connected to the third controlling signal.

6. The driving circuit as claimed in claim 5, wherein the scanning signal satisfies logic relations as follows:

$$Cn=An-1*\text{phase}+An+1*\overline{\text{phase}};$$

$$Bn=\overline{\overline{An*C}*\overline{Cn*C}};$$

where Bn refers to the scanning signal, n is an integral larger than zero, Cn represents a signal output by the selector, phase refers to the first controlling signal, C refers to the third controlling signal, and An−1, An, and An+1 refer to the three consecutive scanning signals.

7. The driving circuit as claimed in claim 6, wherein the logic circuit controls phase lag and phase lead of the scanning signal based on a high or low level of the first controlling signal.

8. A driving circuit, comprising a scanning driving circuit and at least one group of combinational logic circuits, a first group of scanning signals output by an output terminal of the scanning driving circuit, an input terminal of the at least one group of combinational logic circuits connected to the output terminal of the scanning driving circuit or connected to an output terminal of a preceding group of combinational logic circuits, at least one second group of scanning signals output by the output terminal of the at least one group of combinational logic circuits for the driving circuit to output more groups of scanning signals, wherein the at least one group of logic circuits comprise a first group of combinational logic circuits having at least one logic circuit, the logic circuit comprising a first input terminal, a second input terminal, and a third input terminal; the first input terminal, the second input terminal, and the third input terminal all receive three consecutive scanning signals from the first group of scanning signals output by the scanning driving circuit; a scanning signal is generated by the logic circuit according to the three consecutive scanning signals, and wherein the logic circuit further comprises a selector, an inverter, a first NAND gate, a second NAND gate, and an AND gate; an input terminal of the selector comprises a first input terminal and a third input terminal of the logic circuit, an output terminal of the selector is connected to an input terminal of the first NAND gate; another one input terminal of the first NAND gate is connected to an output terminal of the inverter; an input terminal of the second NAND gate is used as the second input terminal; an output terminal of the first NAND gate and an output terminal of the second NAND gate are connected to an input terminal of the AND gate, and an output terminal of the AND gate outputting the scanning signal.

9. The driving circuit as claimed in claim 8, wherein the selector comprises a signal terminal connected to a first controlling signal, the inverter comprises an input terminal connected to a second controlling signal, and the second NAND gate comprises another input terminal connected to a third controlling signal.

10. The driving circuit as claimed in claim 9, wherein the scanning signal satisfies logic relations as follows:

$$Cn = An{-}1 * \text{phase} + An{+}1 * \overline{\text{phase}};$$

$$Bn = \overline{An * C} * \overline{Cn * D};$$

where Bn refers to the scanning signal, n is an integral larger than zero, Cn represents a signal output by the selector, phase refers to the first controlling signal, C refers to the third controlling signal, D refers to the second controlling signal, and An−1, An, and An+1 refer to the three consecutive scanning signals.

11. The driving circuit as claimed in claim 10, wherein the logic circuit controls phase lag and phase lead of the scanning signal based on a high or low level of the first controlling signal, and the logic circuit adjusts the width of the phase of the scanning signal according to the second controlling signal and the third controlling signal.

12. The driving circuit as claimed in claim 8, wherein the signal terminal of the selector is connected to the first controlling signal, and the input terminal of the inverter and the another input terminal of the second NAND gate are connected to the third controlling signal.

13. The driving circuit as claimed in claim 12, wherein the scanning signal satisfies logic relations as follows:

$$Cn = An{-}1 * \text{phase} + An{+}1 * \overline{\text{phase}};$$

$$Bn = \overline{An * C} * \overline{Cn * C};$$

where Bn refers to the scanning signal, n is an integral larger than zero, Cn represents a signal output by the selector, phase refers to the first controlling signal, C refers to the third controlling signal, and An−1, An, and An+1 refer to the three consecutive scanning signals.

14. The driving circuit as claimed in claim 13, wherein the logic circuit controls phase lag and phase lead of the scanning signal based on a high or low level of the first controlling signal.

15. The driving circuit as claimed in claim 9, wherein the at least one group of logic circuits further comprise a second group of combinational logic circuits, an input terminal of the second group of combinational logic circuits is connected to an output terminal of the first group of combinational logic circuits.

* * * * *